(12) United States Patent
Lim et al.

(10) Patent No.: US 8,328,938 B2
(45) Date of Patent: Dec. 11, 2012

(54) BUFFER APPARATUS AND THIN FILM DEPOSITION SYSTEM

(75) Inventors: Cheng-Chung Lim, Singapore (SG); Zhao-Jin Sun, Singapore (SG); Jui-Ling Tang, Chiayi (TW); Chin-Khye Pang, Singapore (SG); Yu-Heng Liu, Singapore (SG)

(73) Assignee: United Microelectronics Corp., Science Based Industrial Park, Hsinchu (TW)

( * ) Notice: Subject to any disclaimer, the term of this patent is extended or adjusted under 35 U.S.C. 154(b) by 1048 days.

(21) Appl. No.: 12/196,040

(22) Filed: Aug. 21, 2008

(65) Prior Publication Data
US 2010/0043701 A1 Feb. 25, 2010

(51) Int. Cl.
*B05C 5/02* (2006.01)
(52) U.S. Cl. ........ 118/600; 118/300; 118/429; 118/715; 366/175.2; 96/220; 95/262
(58) Field of Classification Search ............... 118/429, 118/715, 300, 600; 239/338, 369, 370, 518, 239/521, 524; 422/508, 544, 559; 141/286, 141/369, 374; 96/220; 95/262; 137/571, 137/590; 220/563; 366/150.1, 167.1, 174.1, 366/175.1, 175.2, 165.1, 165.2, 130
See application file for complete search history.

(56) References Cited

U.S. PATENT DOCUMENTS

| | | | | |
|---|---|---|---|---|
| 2,914,398 A | * | 11/1959 | Johnston et al. | ........ 75/677 |
| 3,100,810 A | * | 8/1963 | Meyer | ........ 261/115 |
| 4,484,936 A | | 11/1984 | Sakai | |
| 4,869,849 A | * | 9/1989 | Hirose et al. | ........ 261/78.2 |
| 5,931,990 A | * | 8/1999 | Andrews | ........ 96/163 |
| 6,264,064 B1 | * | 7/2001 | Birtcher et al. | ........ 222/1 |
| 6,913,029 B2 | | 7/2005 | Zorich et al. | |
| 7,334,595 B2 | | 2/2008 | Birtcher et al. | |
| 2005/0249873 A1 | | 11/2005 | Sarigiannis | |
| 2007/0035593 A1 | * | 2/2007 | Iwasaki et al. | ........ 347/85 |

FOREIGN PATENT DOCUMENTS

| | | | |
|---|---|---|---|
| DE | 102005060846 | * | 6/2007 |
| JP | S6474119 | | 3/1989 |
| JP | 05117862 A | | 5/1993 |
| JP | 06132226 A | | 5/1994 |
| JP | 07106294 A | | 4/1995 |
| JP | 2004296614 | | 10/2004 |
| KR | 2005120872 | * | 12/2005 |

OTHER PUBLICATIONS

"Perry's Chemical Engineers' Handbook 7th Edition", 1997, p. 14.96 line 21-22, Edited by Perry, R.H., McGraw-Hill.

* cited by examiner

*Primary Examiner* — Laura Edwards
(74) *Attorney, Agent, or Firm* — Winston Hsu; Scott Margo

(57) ABSTRACT

A buffer apparatus and a thin film deposition system are provided. The buffer apparatus is connected between a liquid material supply apparatus and a deposition machine. The buffer apparatus includes a container and a baffle. The container is used for containing a liquid material supplied from the liquid material supply apparatus. The top of the container has an input hole and an output hole. The baffle is disposed in the container and located under the input hole.

9 Claims, 2 Drawing Sheets

BUFFER APPARATUS AND THIN FILM DEPOSITION SYSTEM

BACKGROUND OF THE INVENTION

1. Field of the Invention

The present invention generally relates to a buffer apparatus and a thin film deposition system, in particular, to a buffer apparatus and a thin film deposition system capable of reducing bubbles generated in a liquid material.

2. Description of Related Art

In the current semiconductor process, the thin film deposition technique is an indispensable and widely applied technique. Generally speaking, before performing a thin film deposition process, a liquid material at a remote end is first transported into a buffer apparatus (for example, an ampoule) by a carrier gas. Then, the liquid material in the buffer apparatus is transported into a deposition machine for deposition. When the liquid material in the buffer apparatus is exhausted, the liquid material at the remote end is transported into the buffer apparatus by the carrier gas once again.

However, when the liquid material at the remote end is transported into the buffer apparatus, too many bubbles are often generated in the buffer apparatus since the liquid material is filled at a high flow rate into the buffer apparatus. These bubbles will be transported into the deposition machine along with the liquid material to cause a problem of non-uniform thin film deposition thickness, thereby influencing subsequent processes.

In order to solve the problem of non-uniform thin film deposition thickness resulted from the bubbles, an undercoat, a precoat, and a dummy deposition processes are generally performed before formally forming a required layer, so as to consume the liquid material having the bubbles. However, since the amount of the bubbles is excessively large, such a manner always wastes too much time and results in a low throughput, and the consumed liquid material will increase the production cost.

SUMMARY OF THE INVENTION

Accordingly, the present invention is directed to a buffer apparatus capable of reducing bubbles generated in a liquid material.

The present invention is further directed to a thin film deposition system capable of reducing a production cost and improving a throughput.

The present invention provides a buffer apparatus connected between a liquid material supply apparatus and a deposition machine. The buffer apparatus includes a container and a baffle. The container is used for containing a liquid material supplied from the liquid material supply apparatus. The top of the container has an input hole and an output hole. The baffle is disposed in the container and located under the input hole.

In the buffer apparatus according to an embodiment of the present invention, the above baffle has, for example, at least one hole, and the hole is not located under the input hole.

In the buffer apparatus according to an embodiment of the present invention, a material of the above baffle is, for example, the same as that of the container.

In the buffer apparatus according to an embodiment of the present invention, the above liquid material is, for example, a low dielectric coefficient material, a tetrakis(dimethylamido) titanium (TDMAT), a tetraethylorthosilicate (TEOS), or a tetramethylcyclotetrasiloxane (TMCATS).

The present invention further provides a thin film deposition system including a deposition machine, a liquid material supply apparatus, and a buffer apparatus. The liquid material supply apparatus is used for supplying a liquid material. The buffer apparatus is connected between the liquid material supply apparatus and the deposition machine. The buffer apparatus includes a container and a baffle. The container is used for containing the liquid material. The top of the container has an input hole and an output hole. The baffle is disposed in the container and located under the input hole.

In the thin film deposition system according to an embodiment of the present invention, the above baffle has, for example, at least one hole, and the hole is not located under the input hole.

In the thin film deposition system according to an embodiment of the present invention, a material of the above baffle is, for example, the same as that of the container.

In the thin film deposition system according to an embodiment of the present invention, the above liquid material is, for example, a low dielectric coefficient material, a TDMAT, a TEOS, or a TMCATS.

The thin film deposition system according to an embodiment of the present invention further has an input pipe connecting the input hole and the liquid material supply apparatus.

The thin film deposition system according to an embodiment of the present invention further has an output pipe connecting the output hole and the deposition machine, and the output pipe extends to a position below a liquid surface of the liquid material in the container through the output hole.

In the thin film deposition system according to an embodiment of the present invention, the above output pipe extends to, for example, a position adjacent a bottom of the container.

In the present invention, the baffle is disposed under the input hole of the container of the buffer apparatus. Therefore, when the liquid material is injected at a high flow rate into the container through the input hole, a flow direction of the liquid material is changed, and meanwhile the flow rate of the liquid material is reduced to reduce bubbles generated by a directly downward impact of the liquid material. In addition, since the amount of the bubbles in the container is reduced, the amount of bubbles transported into the deposition machine is reduced accordingly. Therefore, the consumption of the liquid material may be reduced to lower the production cost, and the throughput of a thin film deposition process is improved.

In order to the make aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
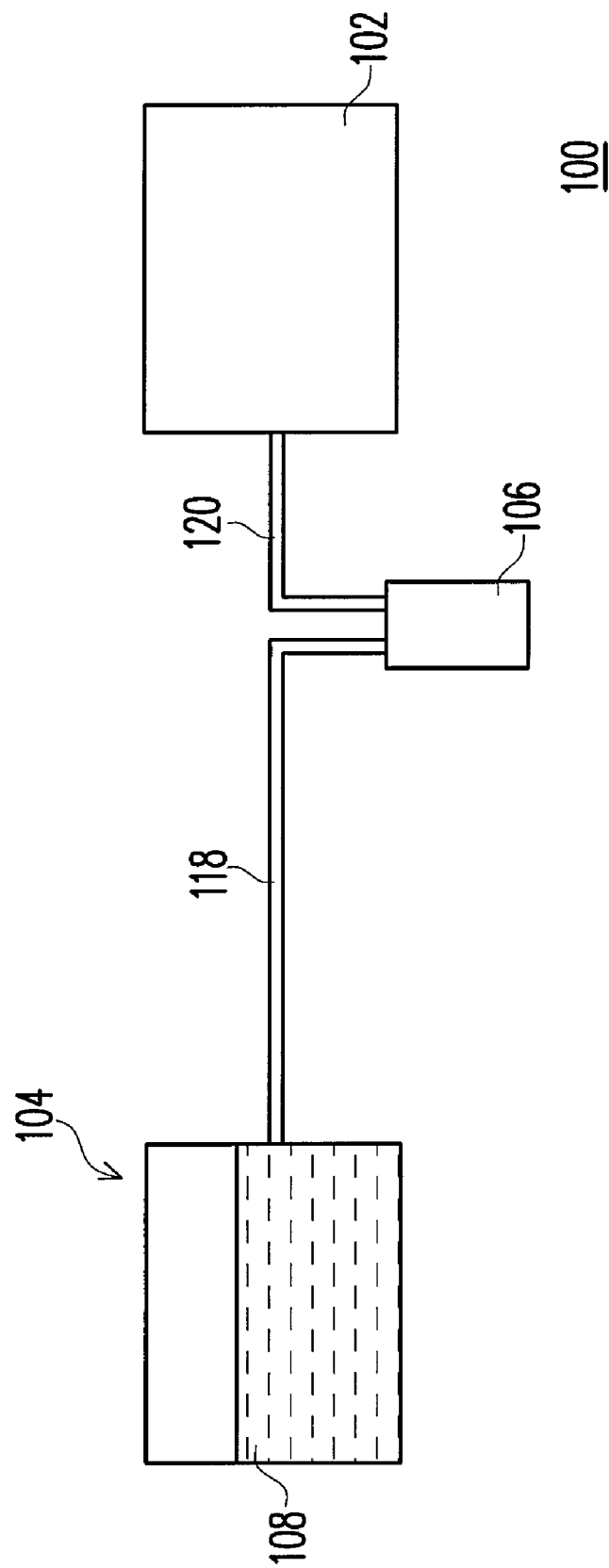
FIG. 1 is a schematic view of a thin film deposition system according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
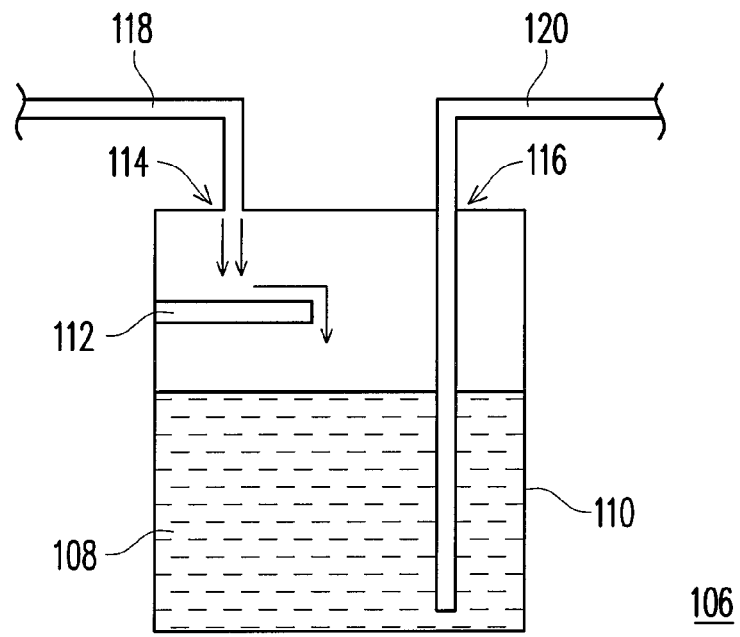
FIG. 2 is a schematic cross-sectional view of a buffer apparatus according to an embodiment of the present invention.

FIG. 1 is a schematic view of a thin film deposition system according to an embodiment of the present invention. FIG. 2 is a schematic cross-sectional view of a buffer apparatus in FIG. 1. Referring to FIGS. 1 and 2, the thin film deposition system 100 includes a deposition machine 102, a liquid material supply apparatus 104, and a buffer apparatus 106. The liquid material supply apparatus 104 is used for supplying a liquid material 108. The liquid material 108 may be used as a material of a thin film deposited when a liquid-phase deposition process is performed or as a precursor of a thin film deposited when a vapor deposition process is performed. That is to say, the deposition machine 102 may be various well-known thin film deposition machines according to the practical requirements. The liquid material 108 is, for example, a low dielectric coefficient material, a tetrakis(dimethylamido) titanium (TDMAT), a tetraethylorthosilicate (TEOS), or a tetramethylcyclotetrasiloxane (TMCATS). The buffer apparatus 106 is connected between the liquid material supply apparatus 104 and the deposition machine 102. The buffer apparatus 106 includes a container 110 and a baffle 112. The container 110 is used for containing the liquid material 108. The top of the container 110 has an input hole 114 and an output hole 116. The baffle 112 is disposed in the container 110 and located under the input hole 114. In addition, the thin film deposition system 100 further has an input pipe 118 connecting the input hole 114 and the liquid material supply apparatus and an output pipe 120 connecting the output hole 116 and the deposition machine 102. The output pipe 120 extends to a position below a liquid surface of the liquid material 108 in the container 110 through the output hole 116. In this embodiment, the output pipe 120 extends to, for example, a position adjacent a bottom of the container 110.

In particular, in the current semiconductor plant, the material for performing the deposition process is placed in a remote material supply apparatus, and is first transported to the buffer apparatus by a carrier gas and then transported to the deposition machine to perform the deposition process. Therefore, in this embodiment, the liquid material 108 in the liquid material supply apparatus 104 is first transported into the container 110 of the buffer apparatus 106 through the input hole 114 via the input pipe 118, and then transported to the deposition machine 102 through the output hole 116 via the output pipe 120. Generally speaking, a volume of the liquid material supply apparatus 104 is, for example, 16 L, while a volume of the buffer apparatus 110 is, for example, 1.2 L. When the liquid material 108 supplied from the liquid material supply apparatus 104 fills the buffer apparatus 110, the liquid material supply apparatus 104 stops supplying the liquid material 108. Afterwards, the buffer apparatus 110 transports the liquid material 108 to the deposition machine 102 until the liquid material 108 in the buffer apparatus 110 is exhausted. Then, the liquid material supply apparatus 104 supplies the liquid material 108 to the buffer apparatus 110 once again.

Since the distance between the liquid material supply apparatus 104 and the buffer apparatus 110 is considerably large, the carrier gas for transporting the liquid material 108 must have sufficient pressure to transport the liquid material 108 to the buffer apparatus 110. The pressure is, for example, 45 psi to 50 psi. Since the above pressure will cause the liquid material 108 to have a considerably high flow rate, the baffle 112 disposed in the container 110 and located under the input hole 114 may resist a direct downward impact (arrows in FIG. 2 indicate a flow direction of the liquid material 108) of the liquid material 108 having the high flow rate, so as to change the flow direction of the liquid material 108 and meanwhile reduce the flow rate of the liquid material 108. Therefore, bubbles generated by the direct downward impact of the liquid material 108 may be reduced, thereby reducing the bubbles transported into the deposition machine along with the liquid material 108. A material of the baffle 112 is, for example, the same as that of the container 110 to avoid unsatisfied reactions between the liquid material 108 and the baffle 112.

Figure 3:
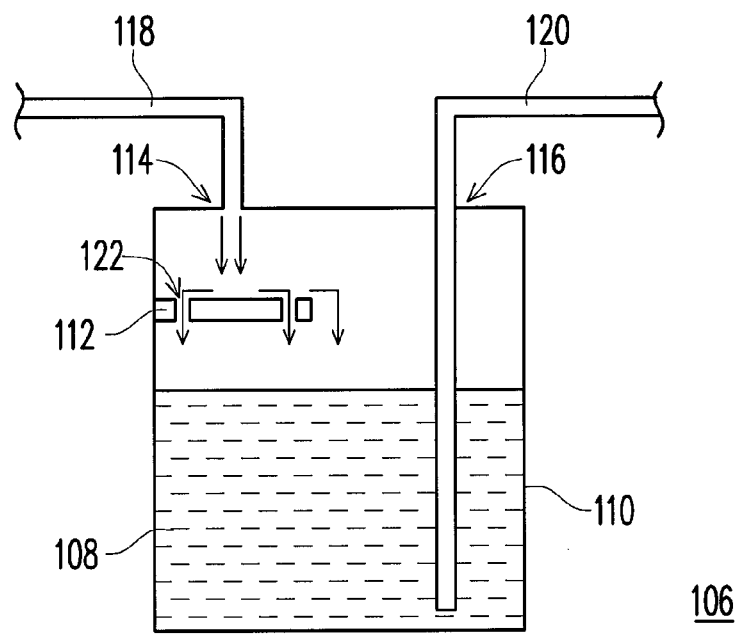
FIG. 3 is a schematic cross-sectional view of a buffer apparatus according to another embodiment of the present invention.

FIG. 3 is a schematic cross-sectional view of a buffer apparatus according to another embodiment of the present invention. Referring to FIG. 3, in this embodiment, the baffle may further have at least one hole 122 to avoid that the liquid material 108 cannot flow down smoothly due to an excessively high viscosity. It should be especially noted that, the hole 122 cannot be located under the input hole 114, otherwise the baffle 112 will be unable to produce the effect of resisting the liquid material 108 having the high flow rate. That is to say, the hole 122 may be located at any position of the baffle 112 according to practical requirements, except the position under the input hole 114, and have any shapes and aperture sizes.

The effects of the present invention will be illustrated in Table 1 below.

TABLE 1

|  | Undercoating Time (seconds) | Precoating Time (seconds) | Number of Times of Dummy Deposition (times) | Amount of Liquid Material (%) |
|---|---|---|---|---|
| Without Baffle | 240 | 120 | 8 | 100.00 |
| With Baffle | 80 | 60 | 1 | 56.50 |

Seen from Table 1, when the container 110 does not have the baffle 112, the required undercoating time and precoating time is respectively 240 seconds and 120 seconds, and 8 times of dummy deposition is needed, so as to consume the liquid material 108 containing bubbles to perform the required thin film deposition process. When the container 110 has the baffle 112, since the amount of bubbles transported to the deposition machine 102 is greatly reduced, both the undercoating time and the precoating time are shortened, and the number of times of the dummy deposition is also reduced, thereby reducing the consumption of the liquid material 108 to lower the production cost and greatly improving the throughput of the thin film deposition process in a fixed time.

In view of the above, in the present invention, the baffle is disposed under the input hole of the container of the buffer apparatus. When the liquid material is injected at a high flow rate into the container through the input hole, the baffle may change a flow direction of the liquid material and reduce the flow rate of the liquid material. Therefore, the problem that too many bubbles are generated by the direct downward impact of the liquid material.

In addition, since the buffer apparatus of the present invention can reduce the bubbles generated due to the direct downward impact of the liquid material, the amount of the bubbles transported into the deposition machine along with the liquid material is reduced accordingly. Therefore, the amount of the liquid material is reduced to achieve the effect of lowering the production cost, and improving the throughput of the thin film deposition process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A buffer apparatus, connected between a liquid material supply apparatus and a deposition machine, comprising:
   a container having a liquid material contained therein, the liquid material supplied from the liquid material supply apparatus, wherein a top of the container has an input hole and an output hole, the input hole being connected to an input pipe, the output hole being connected to an output pipe which extends below the liquid surface level, adjacent to a bottom of the container; and
   a baffle, disposed in the container and located under the input hole, wherein the baffle has at least one hole and the at least one hole is out of alignment with the input hole, and the baffle is a planar structure configured perpendicularly to the input pipe and is disposed above the liquid surface level.

2. The buffer apparatus according to claim 1, wherein a material of the baffle is the same as that of the container.

3. The buffer apparatus according to claim 1, wherein the liquid material supplied from the liquid material supply apparatus is selected from the group consisting of a low dielectric coefficient material, a tetrakis (dimethylamido) titanium (TDMAT), a tetraethylorthosilicate (TEOS), and a tetramethylcyclotetrasiloxane (TMCATS).

4. A thin film deposition system, comprising:
   a deposition machine;
   a liquid material supply apparatus, for supplying a liquid material; and
   a buffer apparatus, connected between the liquid material supply apparatus and the deposition machine, the buffer apparatus comprising:
   a container, for containing the liquid material, wherein a top of the container has an input hole and an output hole, the input hole being connected to an input pipe, the output hole being connected to an output pipe which extends below the liquid surface level, adjacent to a bottom of the container; and
   a baffle, disposed in the container and located under the input hole, wherein the baffle has at least one hole and the at least one hole is out of alignment with the input hole, and the baffle is a planar structure configured perpendicularly to the input pipe and is located completely below the input hole.

5. The thin film deposition system according to claim 4, wherein a material of the baffle is the same as that of the container.

6. The thin film deposition system according to claim 4, wherein the liquid material supplied from the liquid material supply apparatus is selected from the group consisting of a low dielectric coefficient material, a TDMAT, a TEOS, and a TMCATS.

7. The thin film deposition system according to claim 4, further comprising an input pipe connecting the input hole and the liquid material supply apparatus.

8. The thin film deposition system according to claim 4, further comprising an output pipe, connecting the output hole and the deposition machine and passing through the output hole to extend to a position below a liquid surface of the liquid material in the container.

9. The thin film deposition system according to claim 8, wherein the output pipe extends to a position adjacent a bottom of the container.

* * * * *